United States Patent [19]
Horita et al.

[11] Patent Number: 6,150,233
[45] Date of Patent: *Nov. 21, 2000

[54] SEMICONDUCTOR DEVICE AND METHOD OF MANUFACTURING THE SAME

[75] Inventors: Katsuyuki Horita; Takashi Kuroi; Maiko Sakai; Hiromichi Kobayashi, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/118,925

[22] Filed: Jul. 20, 1998

[30] Foreign Application Priority Data

Feb. 13, 1998 [JP] Japan ..................... 10-31468

[51] Int. Cl.⁷ ................................... H01L 21/76
[52] U.S. Cl. .................. 438/424; 438/427; 438/435; 438/437; 148/DIG. 50
[58] Field of Search ..................... 438/424, 427, 438/435, 437, 759; 148/DIG. 50

[56] References Cited

U.S. PATENT DOCUMENTS

| | | |
|---|---|---|
| 5,182,221 | 1/1993 | Sato .......................... 438/424 |
| 5,242,853 | 9/1993 | Sato et al. .................. 438/424 |
| 5,498,565 | 3/1996 | Gocho et al. ................ 438/424 |
| 5,728,621 | 3/1998 | Zheng et al. ................ 438/427 |
| 5,851,899 | 12/1998 | Weigand ..................... 438/424 |

FOREIGN PATENT DOCUMENTS 0 825 645 A1  2/1998  European Pat. Off. .

*Primary Examiner*—Trung Dang
*Attorney, Agent, or Firm*—Oblon, Spivak, McClelland, Maier & Neustadt, P.C.

[57] ABSTRACT

An underlaid silicon oxide film (2) and a polycrystalline silicon film (5) are formed in this order on a surface (1S) of a silicon substrate (1). The polycrystalline silicon film (5) and the underlaid silicon oxide (2) are opened by anisotropic etching, to form a trench (21) extending to the inside of the semiconductor substrate (1). A silicon oxide film (11) formed by HDP-CVD is buried in the trench (21). A resist (41) is formed only on a surface of the silicon oxide film (11) in a device isolation region (20). The silicon oxide film (11) in an active region (30) is removed by dry etching with the resist (41) as a mask. After removing the resist (41), only the polycrystalline silicon film (5) is removed by dry etching. The underlaid oxide film (2) is removed by wet etching with hydrofluoric acid. By this method of manufacturing a semiconductor device, the surface of the semiconductor substrate and a trench-type device isolation are flattened effectively at low cost.

7 Claims, 16 Drawing Sheets

SEMICONDUCTOR DEVICE AND METHOD OF MANUFACTURING THE SAME

BACKGROUND OF THE INVENTION

1. Field of the Invention

The present invention relates to a method of manufacturing a semiconductor device and a semiconductor device manufactured by the method, and more particularly to a technique of flattening a film on a semiconductor substrate having a trench-type device isolation structure.

2. Description of the Background Art

In order to control devices in a completely independent manner during operation in a semiconductor integrated circuit, it is necessary to eliminate electric interference between the devices. For this reason, a device isolation structure having a device isolation region is adopted in the semiconductor integrated circuit, and a trench isolation method is widely known as a method of manufacturing the device isolation structure and a number of improvements in this field have been suggested.

In the trench isolation method, a trench is so formed as to extend inwardly from a surface of the substrate and the trench is filled with a dielectric. Since this device isolation method causes little bird's beak which would be found in a device isolation structure made by LOCOS and needs a smaller area on the surface of the substrate for forming the device isolation structure than the LOCOS, this method, being favorable for size reduction of the semiconductor integrated circuit, is indispensable in a field of semiconductor integrated circuit whose size should be more reduced in future.

In order to achieve the device isolation by the trench isolation method, it is required to bury the dielectric without creating any seam (keyhole-shaped cross-sectional void) inside a trench having a small opening. Among good methods to meet this requirement is a film-formation method such as HDP-CVD (High Density Plasma - Chemical Vapor Deposition) in which an etching and a deposition are simultaneously performed. The following discussion will be made taking the HDP-CVD as an example.

As compared with conventional methods such as a low pressure CVD, the method using the HDP-CVD for burying the dielectric in the trench has the following characteristic features: (a) a film to be formed in the device isolation region can be buried almost flatly to have the same film thickness, not depending on an isolation width, i.e., an opening width of the trench; on the other hand, (b) a section of a film to be deposited on an active region where devices are to be formed depends on a width of the active region and a protrusion having a triangle or trapezoidal section is formed in the active region. Sloped planes of the protrusion are formed at an angle of tilt of 45 degrees with respect to the surface of the substrate from an end portion of the active region. Therefore, the protrusion is of trapezoidal if the active region has a width twice as large as or more than the thickness of the film to be formed.

In a process of manufacturing a size-reduced and multi-layered integrated circuit including the step of the forming the above-mentioned device isolation structure, with reduction of focus margin in a photolithography process and reduction in the amount of film to be overetched in an etching process, it is important to ensure flatness of layers formed on the substrate. Therefore, the CMP is widely adopted when the above-mentioned protrusion is removed and an uppermost surface of the substrate after forming the trench isolation structure is flattened.

Now, with reference to cross sections of FIGS. 22 to 26, the prior-art method of manufacturing a semiconductor device as mentioned above will be discussed.

First, a silicon oxide film 102 and a silicon nitride film 103 are formed on one surface of a semiconductor substrate 101 in this order.

With a photolithography pattern as a mask, a trench 121 is so formed as to extend from a surface of the silicon nitride film 103 inwardly to a predetermined depth the substrate 101 by dry etching as shown in FIG. 22.

Subsequently, a silicon oxide film 111 is deposited by HDP-CVD in the trench 121 serving as a device isolation region 120 and on an active region 130 which is a region other than the trench 121, to be buried in the trench 121 as shown in FIG. 23. As shown in FIG. 22, some regions of the device isolation region 120 and some regions of the active region 130 should be individually distinguished, each of these regions are represented by a reference sign of reference numeral and alphabet, specifically as the device isolation regions 120A, 120C and 120E and the active regions 130B, 130D and 130F. Elements in the device isolation region 120 and the active region 130 are also represented by reference signs of reference numerals and corresponding alphabets to make a distinction of belonging. The same applies to FIG. 23 and the following figures.

Next, the silicon oxide film 111 on the silicon nitride film 103 is removed by CMP with the silicon nitride film 103 as a stopper film (hardmask laser) for polishing, and thereafter a buried oxide 111 made of the silicon oxide film 111 is formed in the trench 121 as shown in FIG. 24.

The silicon nitride film 103 is removed with thermal phosphoric acid as shown in FIG. 25, and subsequently the silicon oxide film 102 is removed with hydrofluoric acid to obtain a trench-type device isolation structure shown in FIG. 26.

The prior-art method of forming the trench-type device isolation structure has the following problems. (Problem 1) Since the CMP is a method to equally polish the whole surface to be polished, when a surface layer with great unevenness such as the silicon oxide film 111 of FIG. 23 is polished by CMP, if the amount of oxide film to be polished is determined in accordance with the thickest portion of the silicon oxide film 111 on the silicon nitride film 103, e.g., the silicon oxide film 111F of FIG. 23, the silicon nitride film 103 which originally serves as a stopper film is also unnecessarily polished as shown in FIG. 24 in the thinnest portion of the silicon oxide 111 on the silicon nitride film 103, e.g., the silicon oxide film 111B of FIG. 23. Therefore, in the flattening method using CMP, a shape of the polished buried oxide 111 depends on the above-mentioned pattern as shown in FIG. 24 and a height of the buried oxide 111 (a length from a bottom of the trench 121 to the uppermost surface of the buried oxide 111) is disadvantageously not uniform in the surface of the substrate 111 as shown in FIG. 26.

Anyway, as mentioned earlier, the film-formation method such as HDP-CVD in which the etching and the deposition are simultaneously performed is indispensable in the field of manufacture of a semiconductor device whose size should be more reduced in future since the method allows the silicon oxide film 111 to be buried almost flatly with uniform thickness without creating any seam inside a trench even if the trench has a small opening. Therefore, it is desired that the buried oxide film 111 formed by HDP-CVD should be flattened without the above-mentioned problem.

As a solution to the above-mentioned problem, U.S. Pat. No. 5,498,565 discloses a method using etching and CMP together for flattening a silicon oxide film formed by HDP-CVD. In this flattening method, an unevenness to be polished is flattened by photolithography and etching to so that the surface can be polished by CMP before polishing by CMP. This prior-art method including two steps of etching and CMP, however, has a problem that the flattening process becomes more complicate than the conventional flattening method using only CMP.

(Problem 2) The conventional method of forming a trench-type device isolation has a disadvantage that the unit price of device increases since it uses CMP which costs high.

It is desired to provide a method not using CMP for flattening a buried oxide film formed by HDP-CVD, to solve Problems 1 and 2.

SUMMARY OF THE INVENTION

The present invention is directed to a method of manufacturing a semiconductor device. According to a first aspect of the present invention, the method comprises: a first step of forming a hardmask layer including at least one layer on a surface of a semiconductor substrate; a second step of forming a trench serving as a device isolation region and an active region which is a region other than the device isolation region inside the semiconductor substrate by etching part of the semiconductor substrate from a predetermined region in a surface of the hardmask layer; a third step of forming a dielectric by a film-formation method in which an etching and a deposition are simultaneously performed on the surface of the hardmask layer and in the trench to bury the dielectric in the trench to the same level as the surface of the hardmask layer; a fourth step of forming a resist on a surface of the dielectric at least in the device isolation region; a fifth step of removing the dielectric in the active region with the resist as a mask, the dielectric is not covered with the resist; and a sixth step of removing the resist and the hardmask layer in this order.

According to a second aspect of the present invention, in the method of the first aspect, at least one layer included in the hardmask layer is hard to etch in dry etching for the dielectric, and the fifth step comprises the step of removing the dielectric by dry etching.

According to a third aspect of the present invention, in the method of the second aspect, at least one layer included in the hardmask layer is a non-single crystalline silicon film.

According to a fourth aspect of the present invention, in the method of the first aspect, the fourth step comprises the step of forming the resist on the dielectric in the active region so that the resist extends by a length corresponding to an alignment margin from an end portion of the device isolation region towards the active region; and the sixth step comprises the step of etching the dielectric using hydrofluoric acid before removing the hardmask layer after removing the resist.

According to a fifth aspect of the present invention, in the method of the fourth aspect, the hardmask layer is formed to have a film thickness larger than twice the alignment margin.

According to a sixth aspect of the present invention, in the method of the fourth aspect, the fourth step comprises the step of forming another resist on the surface of the dielectric in a region between the resist extending to the active region and an adjacent resist thereof when the region has a length not more than a minimum design size of the semiconductor device.

According to a seventh aspect of the present invention, in the method of the sixth aspect, the hardmask layer is formed to have a film thickness larger than a larger one of twice the alignment margin and a sum of the alignment margin and half of the minimum design size.

The present invention is also directed to a semiconductor device. According to an eighth aspect of the present invention, the semiconductor device comprises: a semiconductor substrate; a plurality of trenches each provided in the semiconductor substrate, extending inwardly from one surface of the semiconductor substrate to a predetermined depth, to form a device isolation region in the semiconductor substrate; and a plurality of dielectrics buried in the plurality of trenches without no seam at least to the level of the one surface of the semiconductor substrate, and in the semiconductor device of the eighth aspect, the plurality of dielectrics have flat top portions, and the top portions of the plurality of dielectrics are at the same level.

According to a ninth aspect of the present invention, in the semiconductor device of the eighth aspect, the semiconductor device being manufactured by the method of the first aspect.

(1) Since the semiconductor device with trench-type device isolation whose device isolation region is made of the dielectric can be manufactured, the method of the first aspect can produce an effect of providing a semiconductor device which causes no electrical interference between the active regions and performs a stable operation.

Moreover, since the dielectric is formed by the film-formation method in which the etching and the deposition are simultaneously performed, it is possible, by the method of the first aspect, to bury the dielectrics of the same film thickness in all the trenches almost flatly, not depending on the width of openings of the trenches, with no seam even if the openings have a small width.

Further, since the dielectric on the surface of the hardmask layer is removed by photolithography, the method of the first aspect can produce a remarked effect of providing a semiconductor device with trench-type device isolation whose height (length from the surface of the semiconductor substrate or a bottom of the trench to the top portion (the uppermost surface) of the device isolation) is uniform over the whole surface of the semiconductor substrate, as compared with the trench-type device isolation formed through flattening the surface of the substrate by the conventional CMP.

Further, it is not necessary for the process according to the method of the first aspect to use the CMP which costs high, it is possible to reduce the cost for manufacturing process. Furthermore, since it is possible to avoid non-uniformity and instability of flatness caused by using the CMP, the semiconductor device can achieve still higher yield. Furthermore, as compared with the prior-art technique (U.S. Pat. No. 5,498,565) for flattening the silicon oxide film by using etching and CMP together, the method of the first aspect simplifies the process and allows reduction in cost for production control. Thereby the present invention can provide a low-priced semiconductor device.

(2) Since at least one layer included in the hardmask layer is hard to etch in dry etching for the dielectric and the dielectric is removed by dry etching (the fifth step) in the method of the second aspect, the hardmask layer surely serves as a stopper film for the dry etching and therefore the case where the stopper film (hardmask layer) is also unnecessarily polished, like in polishing the dielectric by the conventional CMP, is avoided. Thus, the method of the second aspect can produce an effect of surely etching necessary and sufficient amounts of dielectric without losing the hardmask layer or etching part of the substrate while achieving the effect (1).

(3) The method of the third aspect can produce the same effect as the effect (2).

(4) Since the resist having the predetermined film thickness is formed also in the region on the dielectric in the active region within a length corresponding to the alignment margin from the end portion of the device isolation region towards the active region, the method of the fourth aspect can produce an effect of preventing the dielectric on the device isolation region from being etched in the fifth step even if a misalignment occurs, along with the effects (1) to (3).

Moreover, since the height of the protrusion made of the dielectric formed on the surface of the hardmask layer is not more than a larger one of twice the alignment margin of the device and the sum of the alignment margin and half of the minimum design size, the method of the fourth aspect can also produce an effect of completely removing the protrusion in the step of removing the dielectric with hydrofluoric acid.

(5) Since the film thickness of the hardmask layer is sufficiently larger than twice the alignment margin, the method of the fifth aspect can produce an effect of preventing the dielectric in the trench, i.e., the uppermost surface of the device isolation from becoming lower than the level of the surface of the substrate in the step of removing the dielectric with hydrofluoric acid, besides the effects (1) to (4).

(6) Since another resist is formed on the surface of the region between two adjacent resists when the region has a length not more than the minimum design size of the semiconductor device in the method of the sixth aspect, the present process of manufacturing the semiconductor device does not create any pattern not larger than the minimum design size. Therefore, the sixth aspect can produce an effect of eliminating the need for reducing the design rule besides the effects (1) to (5).

(7) The method of the seventh aspect can produce the same effect as the effects (1) to (6).

(8) In the semiconductor device of the eighth aspect, since all the top portions of the dielectrics buried in a plurality of trenches are flat and have the same height, it is possible to form an interlayer insulating film, an electrode interconnection layer and the like on the surface of the semiconductor substrate and the top portion of the dielectric with excellent flatness. Further, it is possible, with the dielectric, to realize a highly-size-reduced and highly-integrated semiconductor device which causes no electrical interfere during operation between the devices on one surface of the semiconductor substrate and performs a stable operation.

(9) The device of the ninth aspect can produce the same effect as the effect (1).

The first object of the present invention is to provide a method which costs low for flattening a film formed by HDP-CVD and to thereby provide a method of forming a trench-type device isolation structure of uniform height on the whole surface of a wafer (substrate).

The second object of the present invention is to provide a method of manufacturing a semiconductor device with trench-type device isolation structure with high yield while attaining the first object.

The third object of the present invention is to provide a size-reduced and highly-integrated semiconductor device with trench-type device isolation structure achieving a stable operation while attaining the first and second objects.

The fourth object of the present invention is to provide a new trench structure.

These and other objects, features, aspects and advantages of the present invention will become more apparent from the following detailed description of the present invention when taken in conjunction with the accompanying drawings.

DESCRIPTION OF THE PREFERRED EMBODIMENTS

Viewpoint of the Invention

Figure 1:
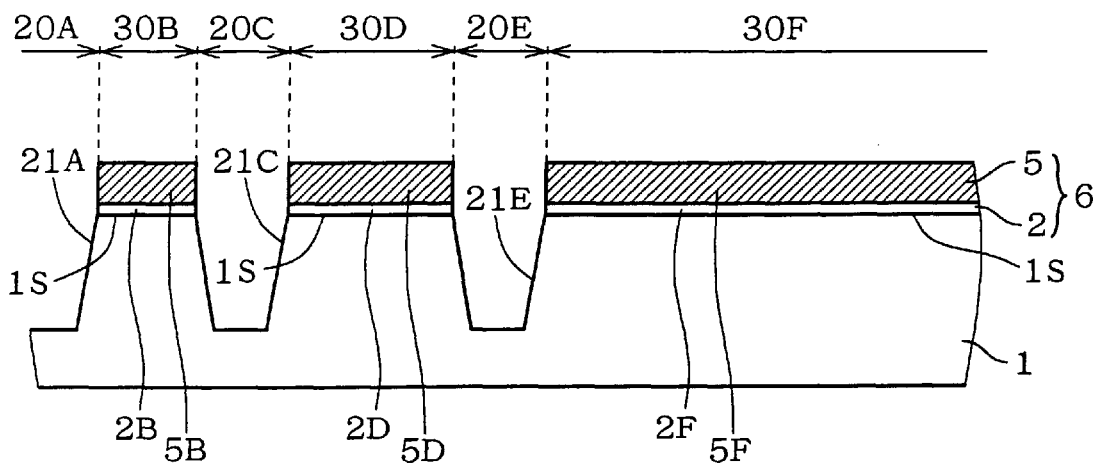
FIGS. 1 to 7 are cross sections showing process steps of manufacturing a semiconductor device in accordance with a first preferred embodiment of the present invention.
Figure 2:
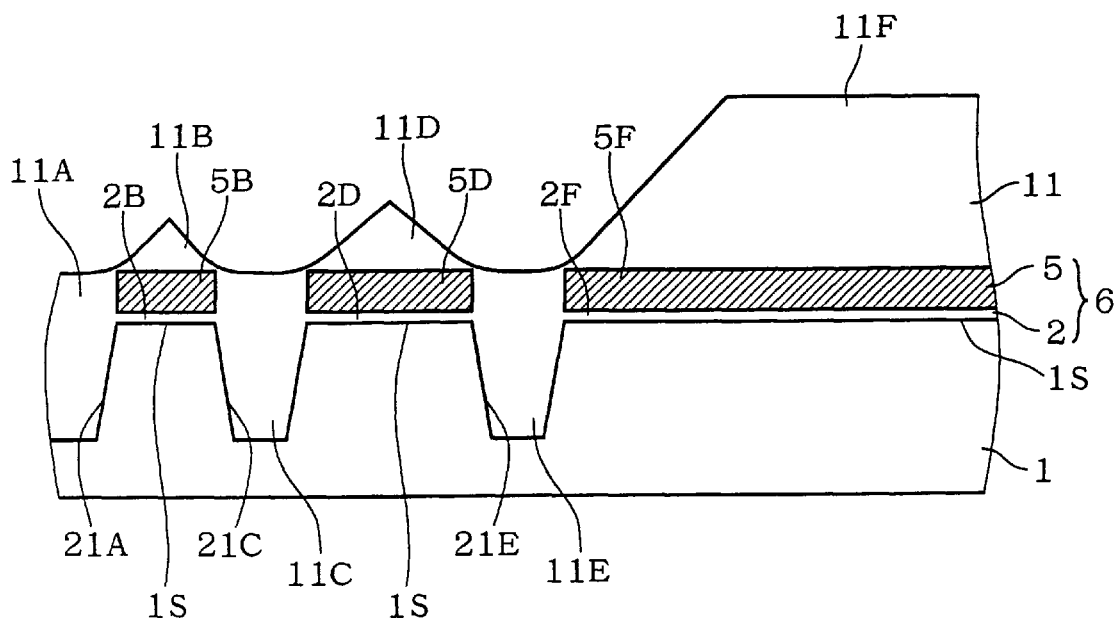

Besides the prior-art technique ① using only CMP for flattening the film deposited by the film-formation method such as HDP-CVD in which the etching and the deposition are simultaneously performed, there is another method ② using etching and CMP together for flattening the film. This technique ② is disclosed in U.S. Pat. No. 5,498,565. In the prior-art method ②, an unevenness of a surface to be polished is flattened before polishing by CMP by photolithography and etching so that the surface can be polished by CMP. Thus, the technical concept of the prior-art technique ② is laid in partial improvement based on the polishing characteristics of the CMP. Moreover, the method using the dry etching and the CMP together is also used in polishing a silicon oxide film formed by the film-formation method other than HDP-CVD, such as a conventional low pressure CVD (see Japanese Patent Application Laid Open Gazette 3-148155 (U.S. Pat. No. 5,006,482)).

By contrast, a method of manufacturing a semiconductor device in accordance with the present invention is achieved as a result of study of the present inventors, to provide a device isolation structure which is flatter and more uniform than that obtained by the flattening technique ① using only the conventional CMP or the above-mentioned flattening technique ② using the etching and the CMP together. In the words, starting from an idea of not using the CMP, a more advantageous flattening technique, instead of the CMP, is established by the present inventors. Therefore, the present invention discussed below has a technical concept different from that of the prior-art techniques ① and ②. In this point, though the present invention may seems to go against today's technical trend using the CMP for flattening, the first and second preferred embodiments discussed below will make it clear that the method of manufacturing a semiconductor device of the present invention can provide a device isolation structure which is flatter and more uniform at lower cost, as compared with each of the prior-art techniques ① and ②.

The First Preferred Embodiment

FIGS. 1 to 7 are cross sections showing process steps of manufacturing a semiconductor device in accordance with the first preferred embodiment. With reference to these figures, detailed discussion will be made on a structure of the semiconductor device and a method of manufacturing the semiconductor device in accordance with the first preferred embodiment.

The First Step

First, a silicon oxide film 2 (hereinafter, referred to also as "underlaid oxide film 2") is formed to have a thickness of 10 to 50 nm by thermal oxidation on one surface 1S of a semiconductor substrate 1 whose base material is e.g., silicon, and a polycrystalline silicon film 5 is formed to have a thickness of 50 to 300 nm on a surface of the silicon oxide film 2.

In the following discussion, a unit of the underlaid oxide film 2 and the polycrystalline silicon film 5 is termed as a "hardmask layer 6" since the underlaid oxide film 2 and the polycrystalline silicon film 5 each serve as a stopper film (hardmask) for the dry etching discussed later.

The Second Step

Next, a portion of the polycrystalline silicon film 5 and the underlaid oxide film 2 to serve as a device isolation region 20 (20A, 20C and 20E) is opened by anisotropic etching with a photolithography pattern as a mask, as shown in FIG. 1, to form a trench 21 (21A, 21C and 21E), extending inwardly from the surface 1S of the semiconductor substrate 1 to a depth of 100 to 500 nm.

Thus, as shown in FIG. 1, the device isolation region 20 including a plurality of regions 20A, 20C and 20E and an active region 30 including a plurality of regions 30B, 30D and 30F are formed in the semiconductor substrate 1.

The device isolation region 20 and the active region 30 are each a three-dimensional region including a two-dimensional region on the surface 1S of the semiconductor substrate 1 and a region in a depth direction of the semiconductor substrate 1 from the surface 1S. Therefore, since the semiconductor substrate 1 is separated into the two regions, i.e., the device isolation region 20 and the active region 30, any region other than the device isolation region 20 refers to the active region 30.

When the regions included in the device isolation region 20 and the active region 30 should be individually distinguished, each of these regions are represented by a reference sign of reference numeral and alphabet, specifically as the device isolation regions 20A, 20C and 20E and the active regions 30B, 30E and 30F. Elements in the device isolation region 20 and the active region 30 are also represented by reference signs of reference numerals and corresponding alphabets to make a distinction of belonging. The same applies to FIG. 2 and the following figures.

The Third Step

A silicon oxide film 11 is deposited on a surface of the polycrystalline silicon film 5 and in the trench 21 by a film-formation method such as HDP-CVD (High Density Plasma - Chemical Vapor Deposition) in which the etching and the deposition are simultaneously performed, to be buried (as buried oxide films 11A, 11C and 11E) in the trench 21. Specifically, the trenches 21 are filled with the silicon oxide films 11B, 11D and 11E to a level of the surface of the polycrystalline silicon film 5. At this time, the maximum value of the film thickness of the silicon oxide film 11 formed on the polycrystalline silicon film 5 corresponds to a sum of the film thickness of the polycrystalline silicon film 5 and the silicon oxide film 2 and a depth (height) from the surface 1S of the semiconductor substrate 1 (the sum is in a range of about 160 to 850 nm). The following discussion will be made taking a case where the silicon oxide film 11 is formed by HDP-CVD.

The silicon oxide film 11 buried in the trench 21, in particular, is hereinafter referred to also as "buried oxide 11".

The buried (silicon) oxide film 11 performs a function of device isolation, that is, eliminating an electrical interference between devices formed in adjacent active regions. From a viewpoint of the function, any dielectric can be used to fill the trench 21, and specifically, for example, a silicon oxinitride (SiON) film, a silicon nitride film or the like formed by HDP-CVD can be used, instead of the silicon oxide film.

Brief discussion will be made now on the HDP-CVD which is one of film-formation methods in which the etching and the deposition are simultaneously performed. In this film-formation method, the deposition and the etching are simultaneously performed by using high density plasma. As mentioned earlier, the HDP-CVD allows the silicon oxide to be buried in a trench of high aspect ratio without creating any seam. The HDP-CVD is described in detail, for example, in "Solid State Technology", April, 1996, pp. 63 to 73.

The Fourth Step

Figure 3:
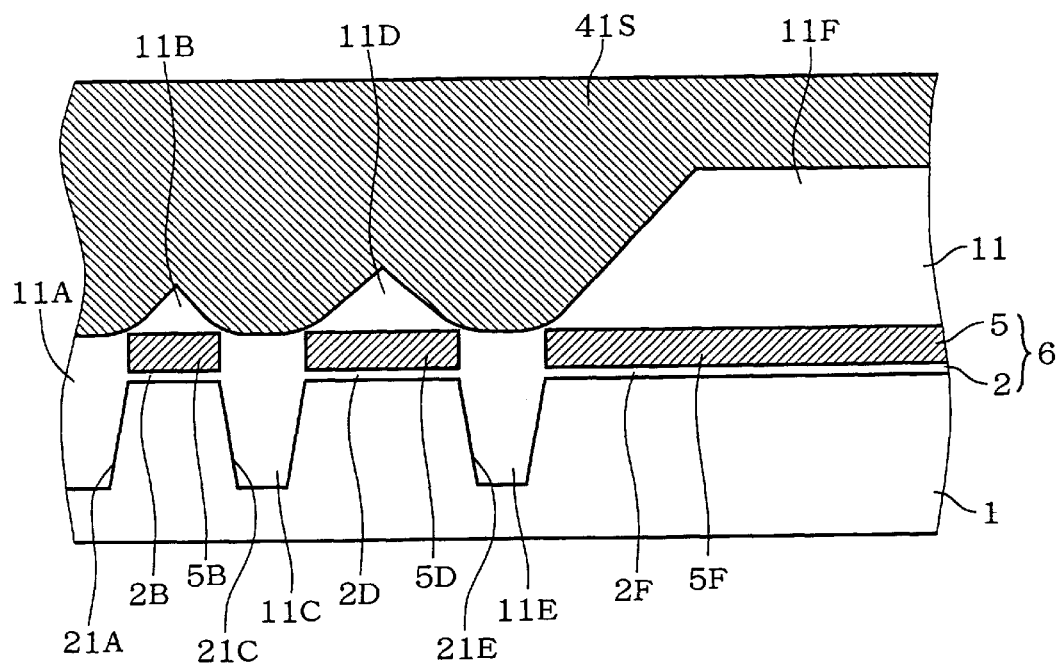
Figure 4:
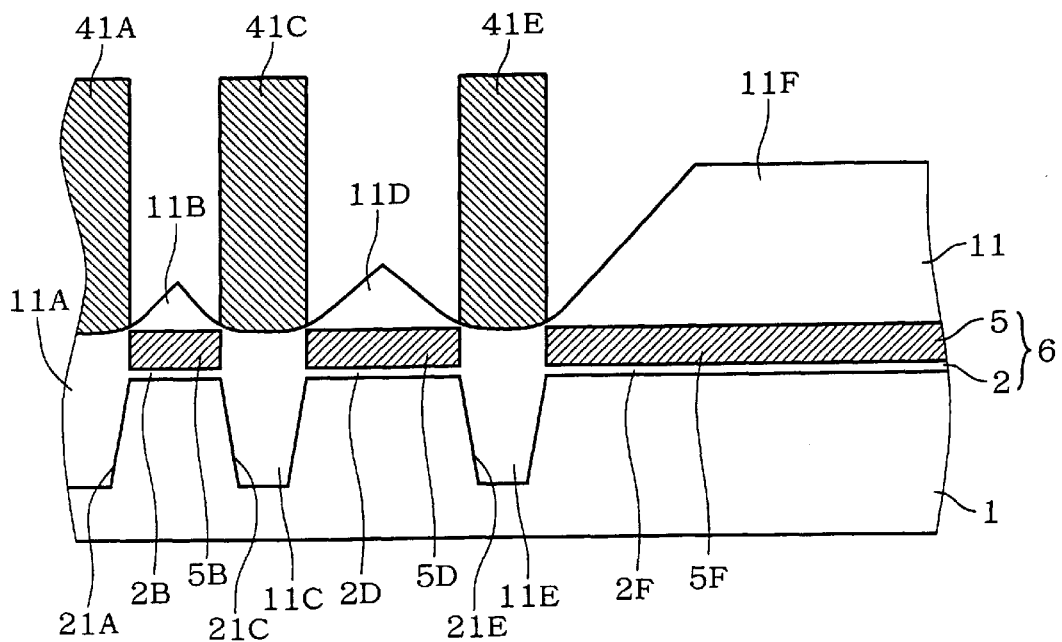

A resist 41S is formed on the whole surface of the silicon oxide film 11 as shown in FIG. 3 and patterned by photolithography to form a resist 41 (41A, 41C and 41E) only on the surface of the buried oxide film 11 (11A, 11C and 11E) serving as a trench-type device isolation region as shown in FIG. 4.

The Fifth Step

Figure 5:
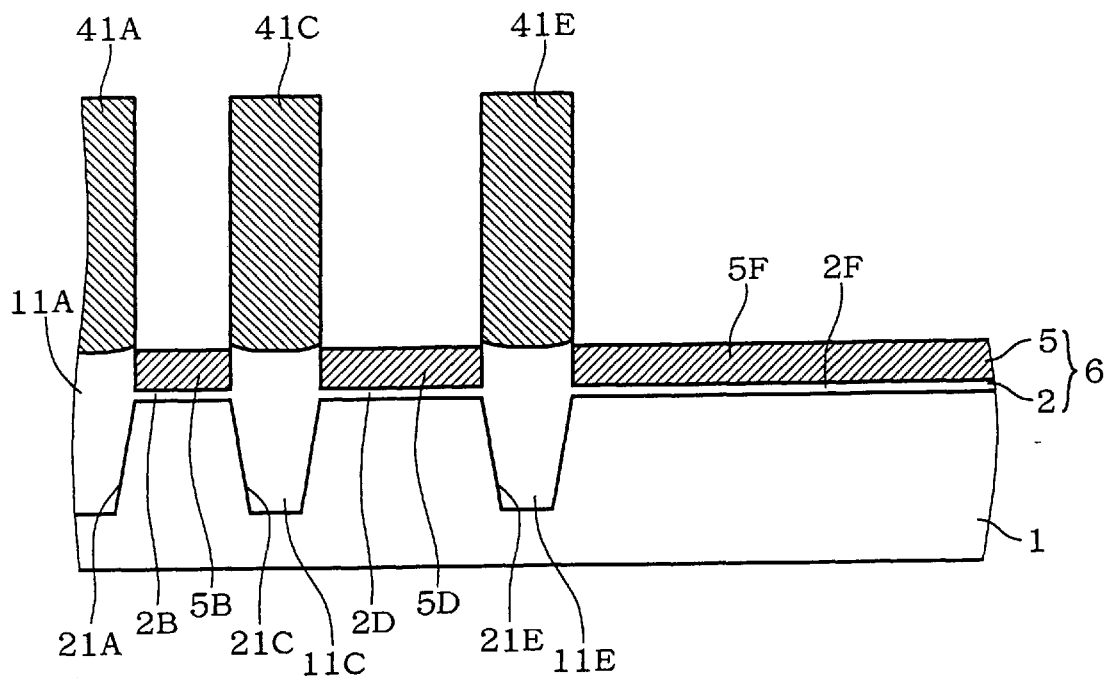

With the resist 41 as a mask, the silicon oxide film 11 which is not covered with the resist 41 is removed by dry etching using e.g., $CF_4$ gas (see FIG. 5). In this case, the polycrystalline silicon film 5 has a etching selection ratio sufficiently higher than that of the silicon oxide film 11 and therefore is little etched. Thus, the polycrystalline silicon film 5 serves as a hardmask (stopper film) in the dry etching for the silicon oxide film 11 and is one of layers included in the hardmask layer 6 which is hard to etch in the dry etching for the silicon oxide film 11. Further, non-single crystalline silicon film, e.g., amorphous silicon film may be used, instead of the polycrystalline silicon film 5.

The Sixth Step

Figure 6:
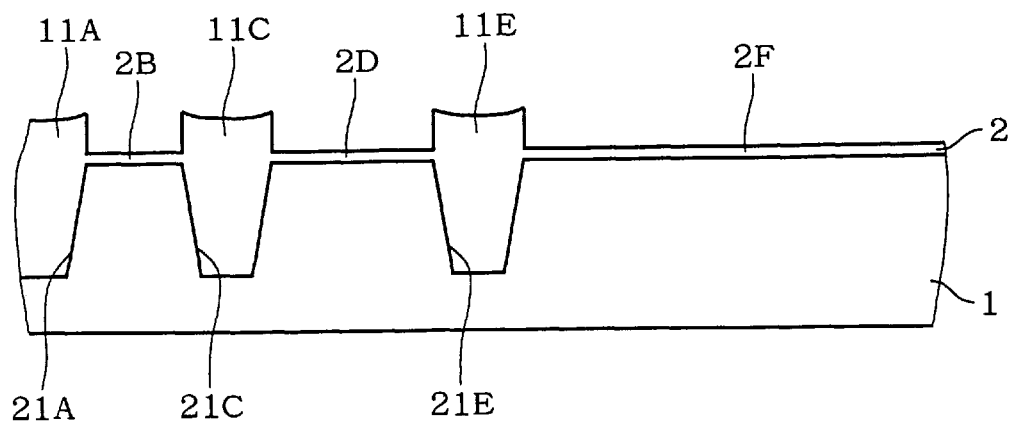

After removing the resist 41 of FIG. 5, only the polycrystalline silicon film 5 is removed by dry etching using e.g., $CF_4$ gas (see FIG. 6). In this case, contrary to the fifth step, the silicon oxide film 2, i.e., the underlaid oxide film 2 serves as the hardmask (stopper film) in the dry etching for the polycrystalline silicon film 5.

Thus, the polycrystalline silicon film 5 and the underlaid oxide film 2 serve as the hardmask (stopper film) in the fifth and sixth steps, respectively Therefore, the first step is regarded as a step for forming the hardmask layer 6 including layers which serve as the hardmask in the selective removing of the silicon oxide film 11 in the active region 30 (see FIG. 1).

Figure 7:
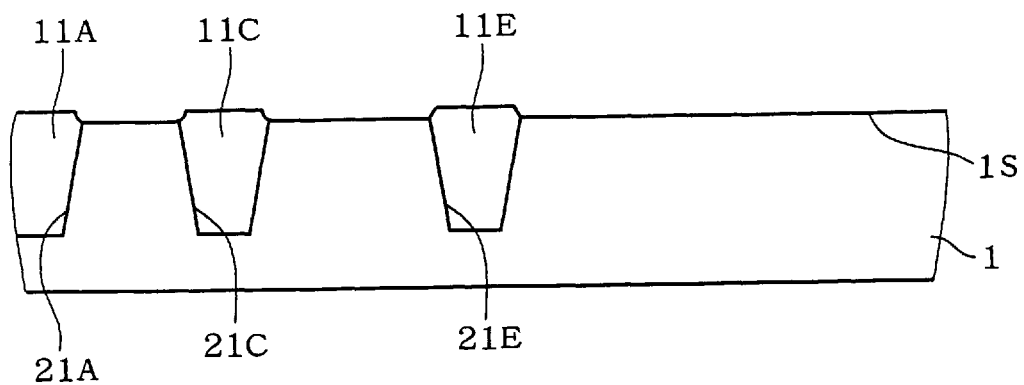

The silicon oxide film 2 which is the underlaid oxide film of FIG. 6 is removed by wet etching using hydrofluoric acid to form a cuneate device isolation dielectric made of the silicon oxide film 11 in the trench 21 as shown in FIG. 7. Hereinafter, the buried oxide film 11 is referred to also as "cuneate device isolation dielectric 11".

In the semiconductor device with device isolation structure obtained by the above steps, a top portion of the device isolation dielectric made of the silicon oxide film 11 and the surface 1S of the semiconductor substrate 1 each have a more excellent flatness than those flattened by the conventional CMP. As to a plurality of device isolation dielectrics, their heights from the surface 1S of the semiconductor substrate 1 to the top portions of the device isolation dielectrics (the silicon oxide films 11) are more uniform than those of the device isolation flattened by the conventional CMP.

Effect of The First Preferred Embodiment

Figure 24:
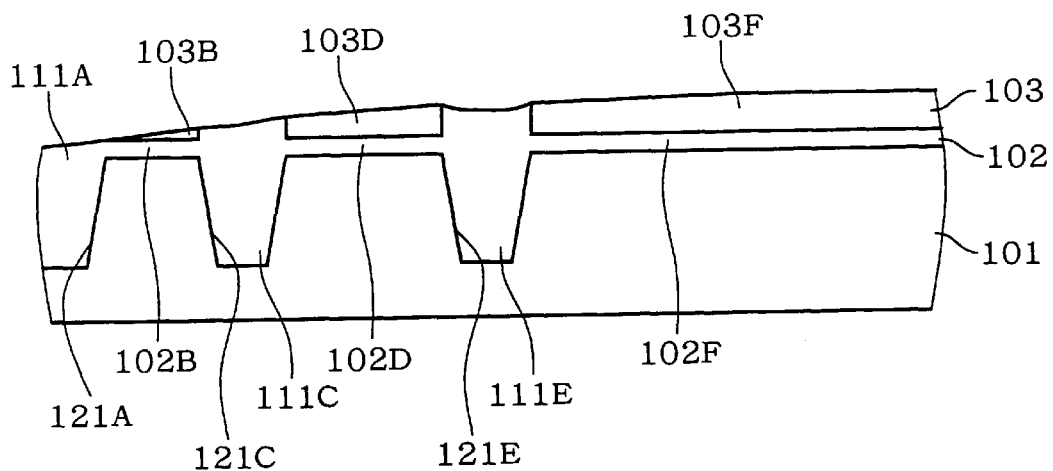
Figure 25:
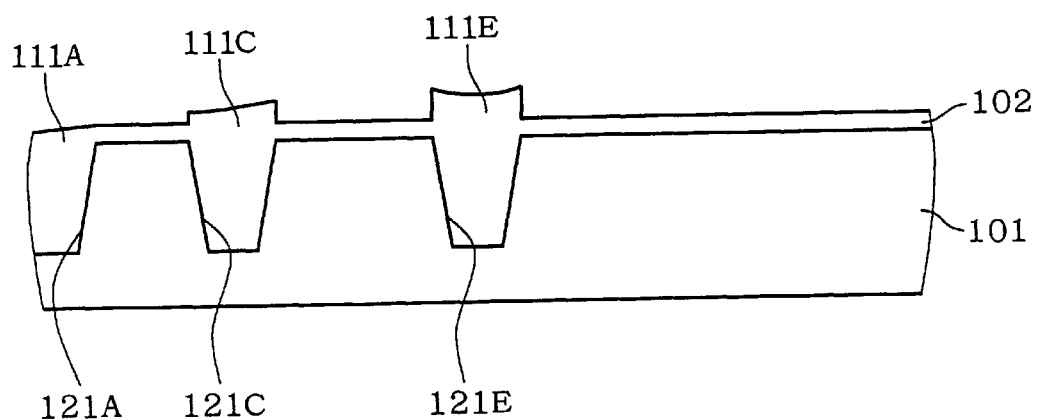

Thus, the method of manufacturing the semiconductor device of the first preferred embodiment avoids a problematic case like in the prior art where the problem that the stopper film (the silicon nitride film 103 of FIG. 24) is unnecessarily polished as shown in FIG. 24 in polishing the silicon oxide film 111 (see FIG. 2) formed by the conventional CMP since the surface of the silicon oxide film 11 in the device isolation region 20 is covered with the resist 41 and only the exposed silicon oxide film 11 in the active region 30 is dry-etched and further the polycrystalline silicon film 5 serves as the stopper film in the dry etching. Therefore, it is possible to etch necessary and sufficient amounts of silicon oxide film 11 without losing the polycrystalline silicon film 5 or etching part of the semiconductor substrate 1 (①).

Figure 26:
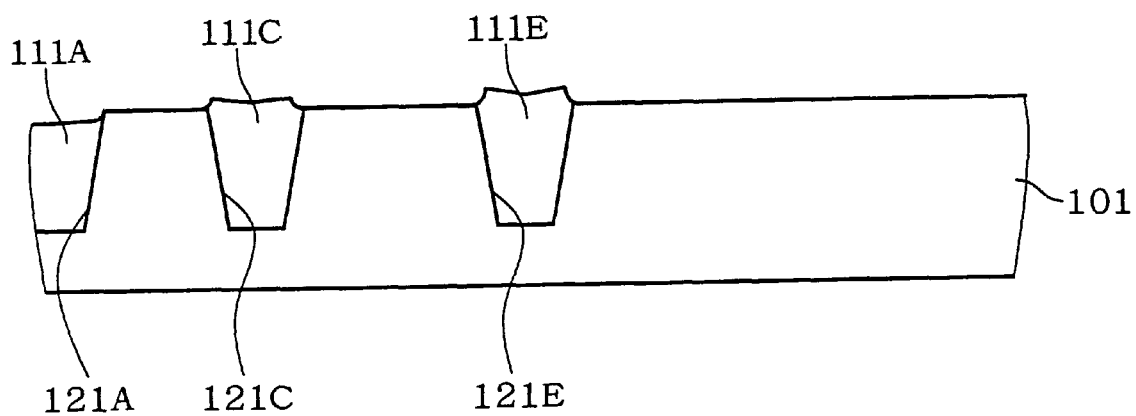

On the other hand, the film thickness of the buried oxide 11 does not depend any longer on the two-dimensional pattern of the active region 30 and the device isolation region 20 formed on the surface 1S of the semiconductor substrate 1 since it is possible, from the film-formation characteristics of the film-formation method such as HDP-CVD in which the etching and the deposition are simultaneously performed, to bury the silicon oxide 11 in the trench 21 almost flatly with the same film thickness without depending on the width of the trench 21 in the device isolation region 20 or creating any seam. Therefore, variation in height of the buried oxide 11 which is buried in the semiconductor substrate 1 (the height ranges from the surface 1S of the semiconductor 1 to the top portion (the uppermost surface) of the buried oxide film 11 or from the bottom portion of the trench 21 to the top portion (the uppermost surface) of the buried oxide film 11) becomes sufficiently smaller than that of the buried oxide 111 (see FIG. 26) formed by polishing using the conventional CMP, so that the flatness of the device isolation region 20 becomes very good (②).

Further, since the CMP is not used in the process of flattening the active region 30 and the device isolation region 20, it is possible to avoid any already-existing problem caused by the flattening process using CMP. Therefore, the surface 1S of the semiconductor substrate 1 in the active region 30 can have a very excellent flatness (③).

With the above effects ② and ③, an interlayer insulating film, an electrode interconnection layer and the like formed on the surface 1S of the semiconductor substrate 1 in the active region 30 or on the buried oxide 11 serving as the device isolation dielectric can have an excellent flatness, and therefore the method of manufacturing the semiconductor device of the first preferred embodiment is favorable for manufacture of a semiconductor device with multilayered interconnection structure.

Thus, since it is possible to avoid nonuniformity and instability of flatness caused by using the CMP, the semiconductor device can achieve still higher yield (④). Further, since it is not necessary to use the CMP which costs high, it is possible to reduce the cost for manufacturing process (⑤). Furthermore, as compared with the prior-art technique (U.S. Pat. No. 5,498,565) for flattening the silicon oxide film 11 by using etching and CMP together, the method of the first preferred embodiment simplifies the process and allows reduction in cost for production control (⑥).

With the above effects ① to ⑥, a highly-size-reduced and highly-integrated semiconductor device which can perform a stable operation is achieved by the method of manufacturing the semiconductor device of the first preferred embodiment.

The Second Preferred Embodiment

The method of manufacturing the semiconductor device of the second preferred embodiment discussed below is based on the same technical concept as the method of the first preferred embodiment, and the method of the second preferred embodiment is preferable in that it can respond to alignment precision in photolithography of resist.

Now, with reference to the cross sections of FIGS. 8 to 14 showing manufacturing steps, discussion will be made on a structure of the semiconductor device and a method of manufacturing the semiconductor device in accordance with the second preferred embodiment, concentrating on difference from those of the first preferred embodiment.

Figure 8:
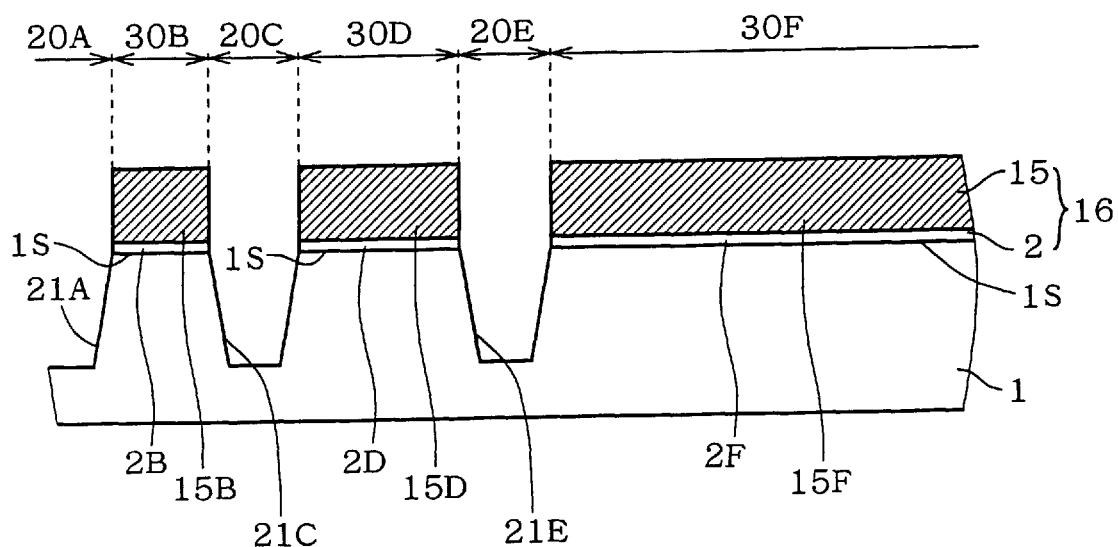
FIGS. 8 to 14 are cross sections showing process steps of manufacturing a semiconductor device in accordance with a second preferred embodiment of the present invention.

Like in the first preferred embodiment, the device isolation region 20 of FIG. 8 is distinctively represented by using the reference signs 20A, 20C and 20E and the active region 30 of FIG. 8 is distinctively represented by using the reference signs 30B, 30D and 30F. Elements in the device isolation region 20 and the active region 30 are also distinctively represented, and the same applies to FIG. 9 and the following figures.

The First Step

First, the silicon oxide film 2 (hereinafter, referred to also as "underlaid oxide film 2") is formed to have a thickness of 10 to 50 nm by thermal oxidation on the surface 1S of the semiconductor substrate 1 whose base material is e.g., silicon, and a polycrystalline silicon film 15 is formed to have a thickness larger than a predetermined value on the surface of the silicon oxide film 2. The predetermined value of film thickness is a larger one of twice an alignment margin (2a) (the alignment margin is a conceivable maximum value of misalignment and represented by "a") and a sum of the alignment margin a and half of the minimum design size (represented by "r") (a+r/2). The reason and effect of defining the film thickness of the polycrystalline silicon film 15 as above will be discussed later.

The Second Step

Next, portions of the polycrystalline silicon film 15 and the underlaid oxide film 2 which is to be the device isolation region 20 are opened by anisotropic etching with a photolithography pattern as a mask, as shown in FIG. 8, to form trenches 21, extending inwardly from the surface 1S of the semiconductor substrate 1 to a depth of about 100 to 500 nm.

In the method of manufacturing the semiconductor device of the first and second preferred embodiments, the silicon oxide film formed by thermal oxidation or CVD on the polycrystalline silicon film 5 or 15 can be used as the mask for the anisotropic etching to form the trenches. In this case, the following points should be noted. First, another photolithography is needed for patterning the silicon oxide film to be used as the mask. Second, in the method of the second preferred embodiment, this silicon oxide film and a silicon oxide film 11F formed by HDP-CVD (see FIG. 9) are united and removed as a united silicon oxide film in the wet etching step discussed later. In this case, since a shape of a protrusion (which corresponds to a protrusion 11T of FIG. 11) is different from that of the protrusion 11T discussed later, it is necessary to change a definition of the amount of films to be etched in the wet etching discussed later.

The Third Step

The silicon oxide film 11 is deposited by e.g., HDP-CVD on a surface of the polycrystalline silicon film 15 and in the trench 21, and thereby the silicon oxide film 11 (buried oxide films 11A, 11C and 11E) is buried in the trench 21. Specifically, the trench 21 is filled with the silicon oxide film 11 to a level of the surface of the polycrystalline silicon film 15. In this case, the maximum value of the film thickness of the silicon oxide films 11B, 11D and 11F formed on the polycrystalline silicon film 15 corresponds to a sum of the film thickness of the polycrystalline silicon film 15 and the silicon oxide film 2 and a depth (height) of the trench 21 from the surface 1S of the semiconductor substrate 1. The following discussion will be made taking a case where the silicon oxide film 11 is formed by HDP-CVD.

The Fourth Step

Figure 10:
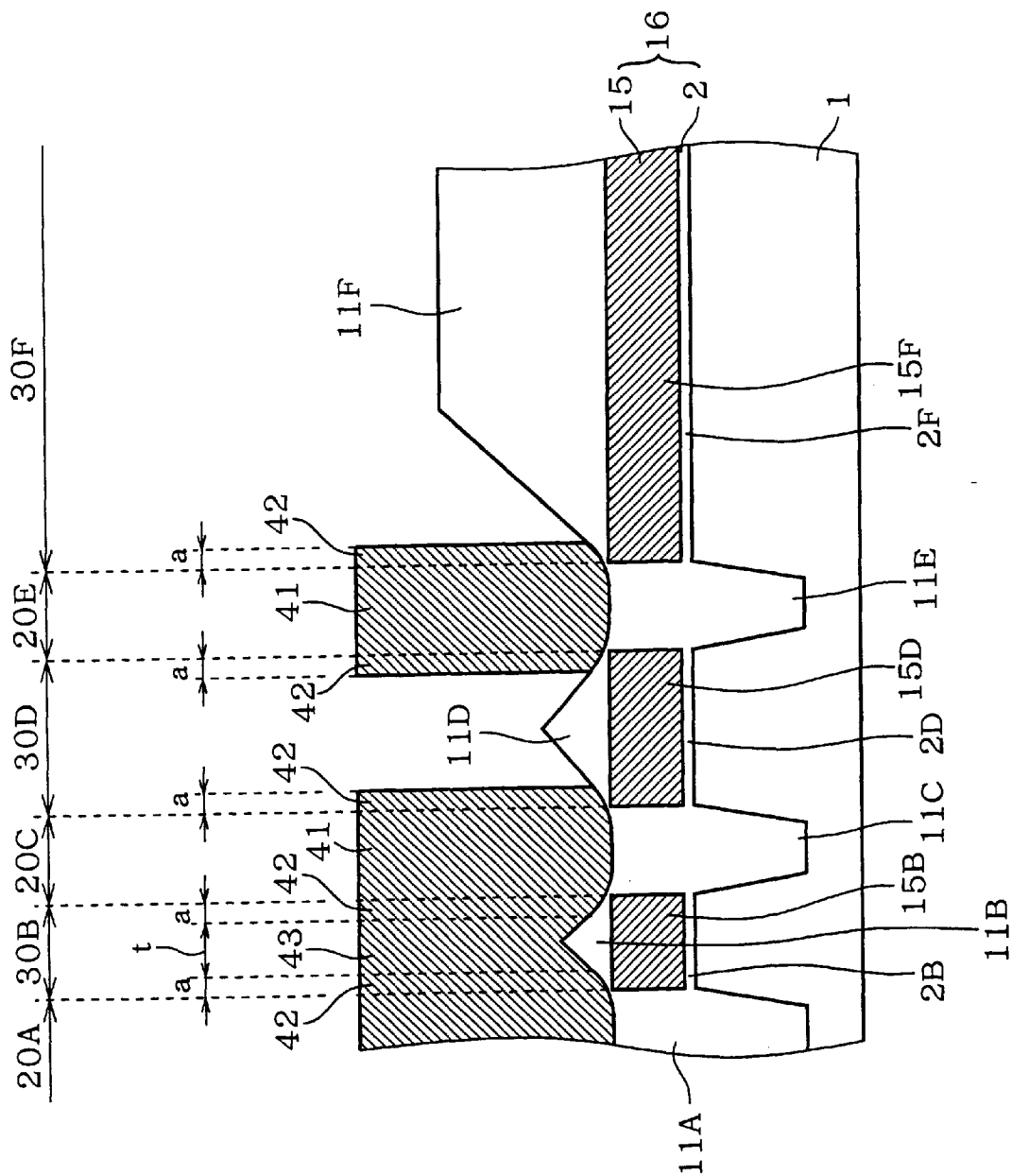

The resist 41S is formed on the whole surface of the silicon oxide film 11 (see FIG. 3), and the resist 41S is patterned by photolithography to form the resist 41 of predetermined shape shown in FIG. 10. In this case, the patterning is made so that the predetermined shape of the resist 41 may extend from an end portion of the device isolation region 20 towards the active region side 30 only by a length of the alignment margin a. Hereinafter, the portion of the resist 41 extending from the end portion of the device isolation region 20 towards the active region side 30 is referred to as "the second resist portion 42" (see FIG. 10) as distinction is needed.

In a too small region included in the active region 30, e.g., the active region 30B of FIG. 10, when the resist 41 extends from the ends of the adjacent device isolation regions 20A and 20C towards the active region sides 30B to form the second resist portions 42 in the active region 30B, if the width t of a region of the active region 30B in which the second resist portion 42 does not exist is not larger than the minimum design size r of the semiconductor device, the resist 41 is formed on the whole surface of the region. In this case, the portion of the active region 30B whose width t is not larger than the minimum design size r as the result of formation of the second resist portions 42 in the active region 30B is referred to as "the third resist portion 43" (see FIG. 10) as distinction is needed. The reason and effect of formation of the second and third resist portions will be discussed later.

The Fifth Step

Figure 11:
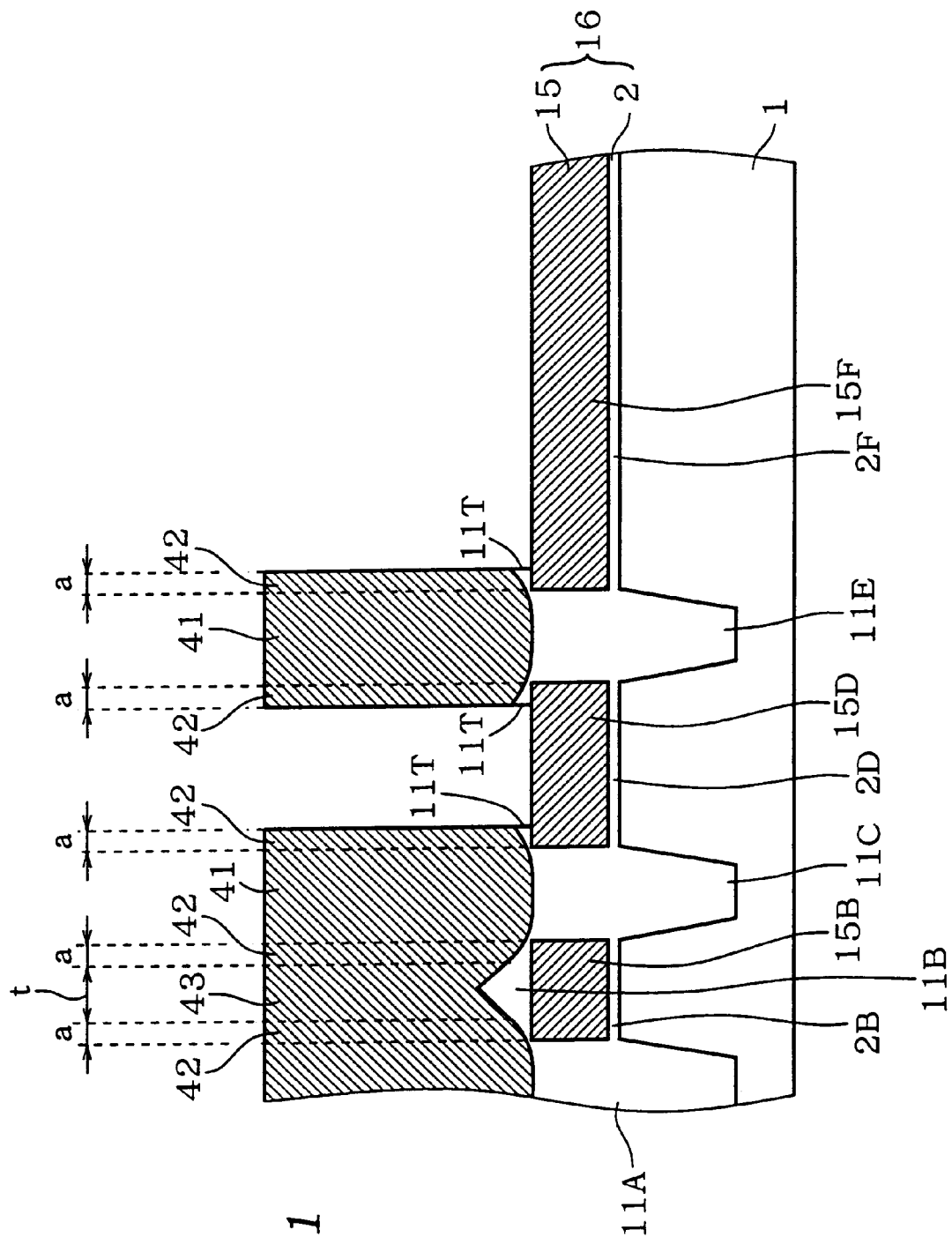

With the resist 41 of FIG. 10 as a mask, the silicon oxide film 11 which is not covered with the resist 41 is removed by dry etching with e.g., $CF_4$ gas as shown in FIG. 11, to expose the surface of the polycrystalline silicon film 15. In this removing, the polycrystalline silicon film 15, which is little etched, serves as the hardmask (stopper film) in the dry etching for the silicon oxide film 11 and is one of layers constituting a hardmask layer 16 which is hard to etch in the dry etching for the silicon oxide film 11, like in the first preferred embodiment.

The Sixth Step

Figure 12:
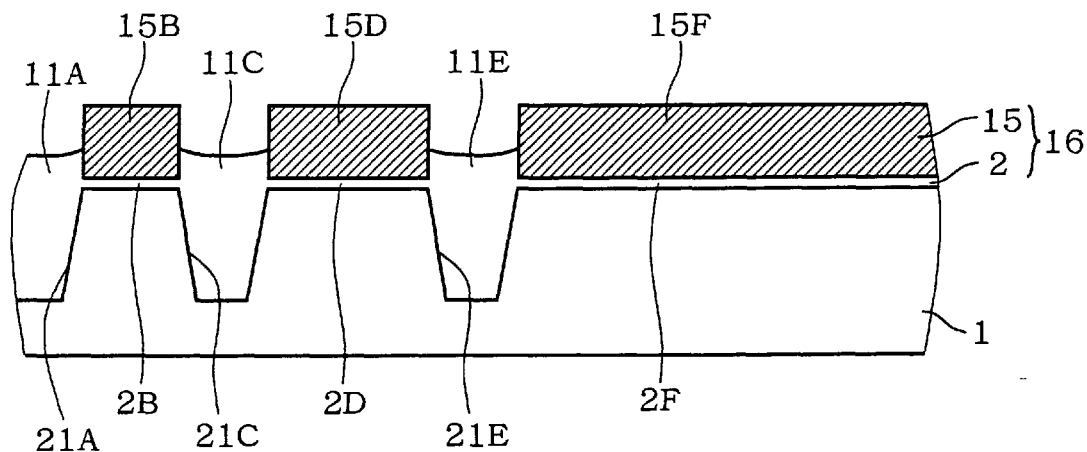

After removing the resist 41 of FIG. 11, the silicon oxide film 11B and the protrusion 11T made of the silicon oxide film 11 left on the end portion of the polycrystalline silicon film 15 are removed by wet etching with hydrofluoric acid as shown in FIG. 12. In this removing, the amount of silicon oxide film to be etched is determined so that the silicon oxide film having a film thickness of a larger one of twice the alignment margin a (2a) of the semiconductor device and a sum of the alignment margin a and half of the minimum design size r (a+r/2) of the semiconductor device can be sufficiently removed.

Figure 13:
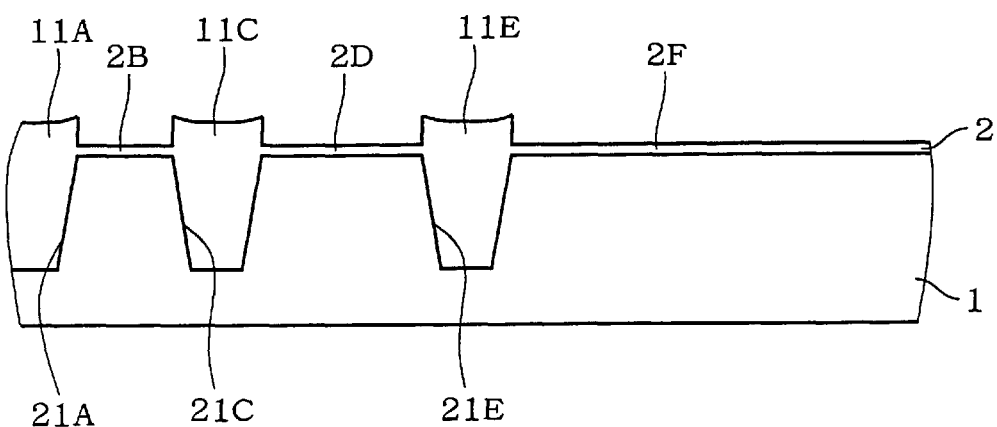
Figure 14:
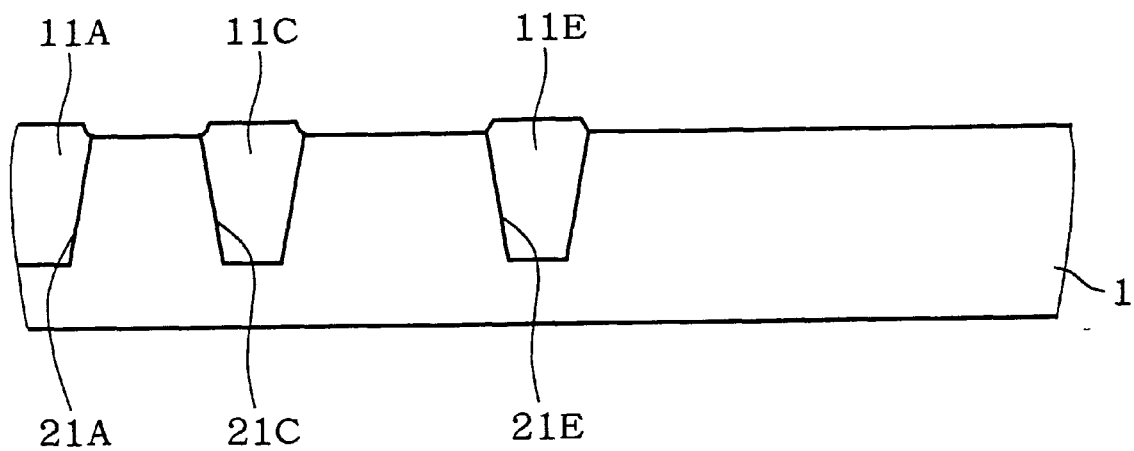

After that, the polycrystalline silicon film 15 is removed by dry etching with e.g., $Cl_2$ gas as shown in FIG. 13. In this removing, the underlaid oxide film 2 serves as the hardmask (stopper film) in the dry etching for the polycrystalline silicon film 15, like in the first preferred embodiment. Therefore, like in the first preferred embodiment, the first step is regarded as a step for forming the hardmask layer 16 including layers which serve as the hardmask in the selective removing of the silicon oxide film 11 in the active region 30.

Further, the underlaid oxide film 2 is removed by wet etching with hydrofluoric acid to form the cuneate device isolation dielectric made of the silicon oxide film 11 in the trench 21.

Essence of The Second Preferred Embodiment

Figure 15:
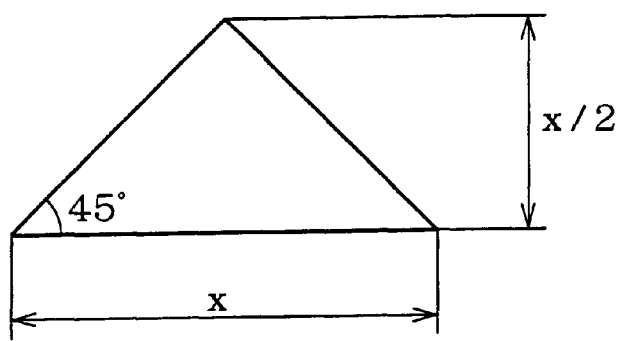
FIGS. 15 to 17 are illustrations for explaining a process of manufacturing a semiconductor device in accordance with the second preferred embodiment of the present invention.
Figure 16:
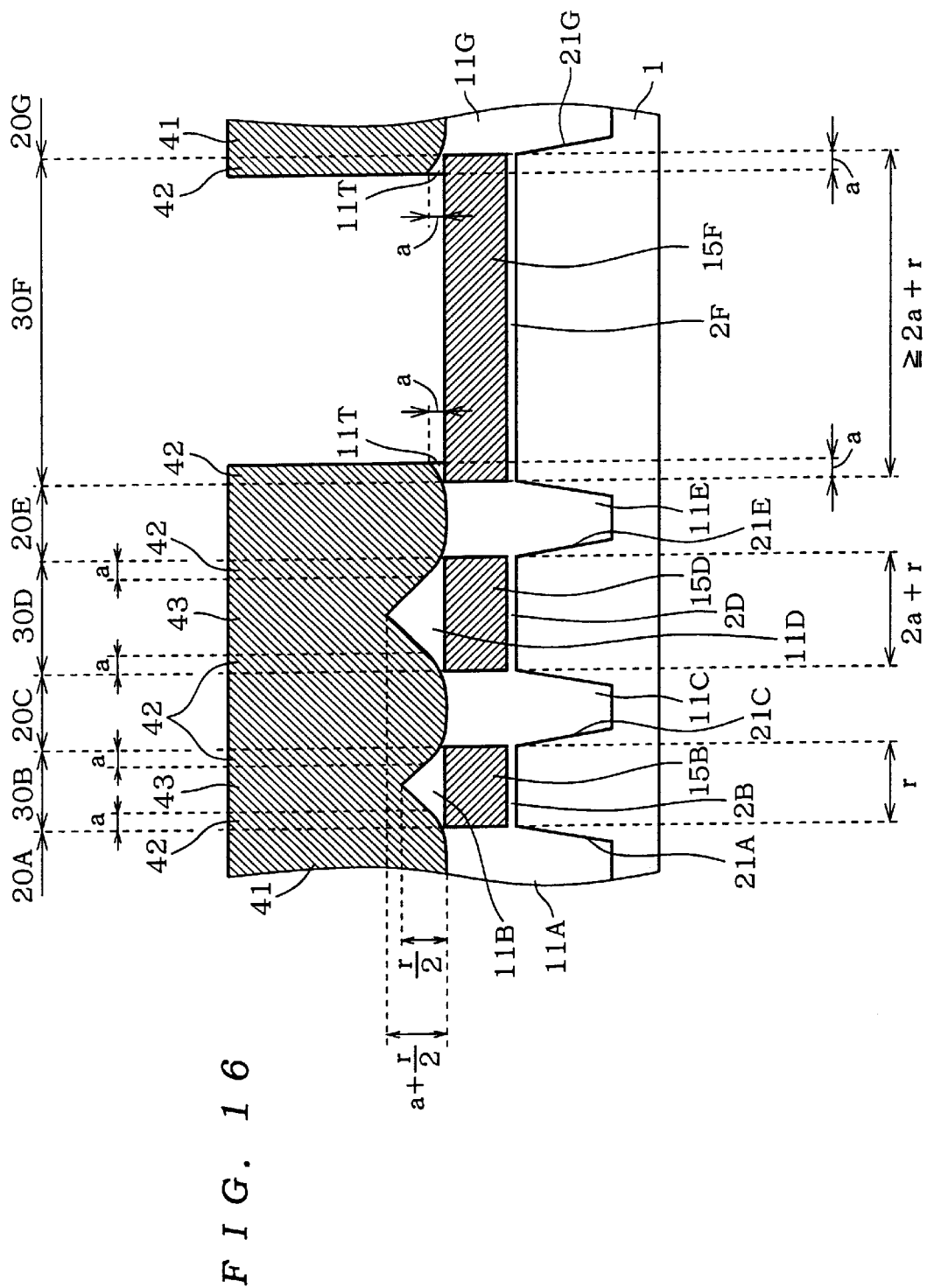
Figure 17:
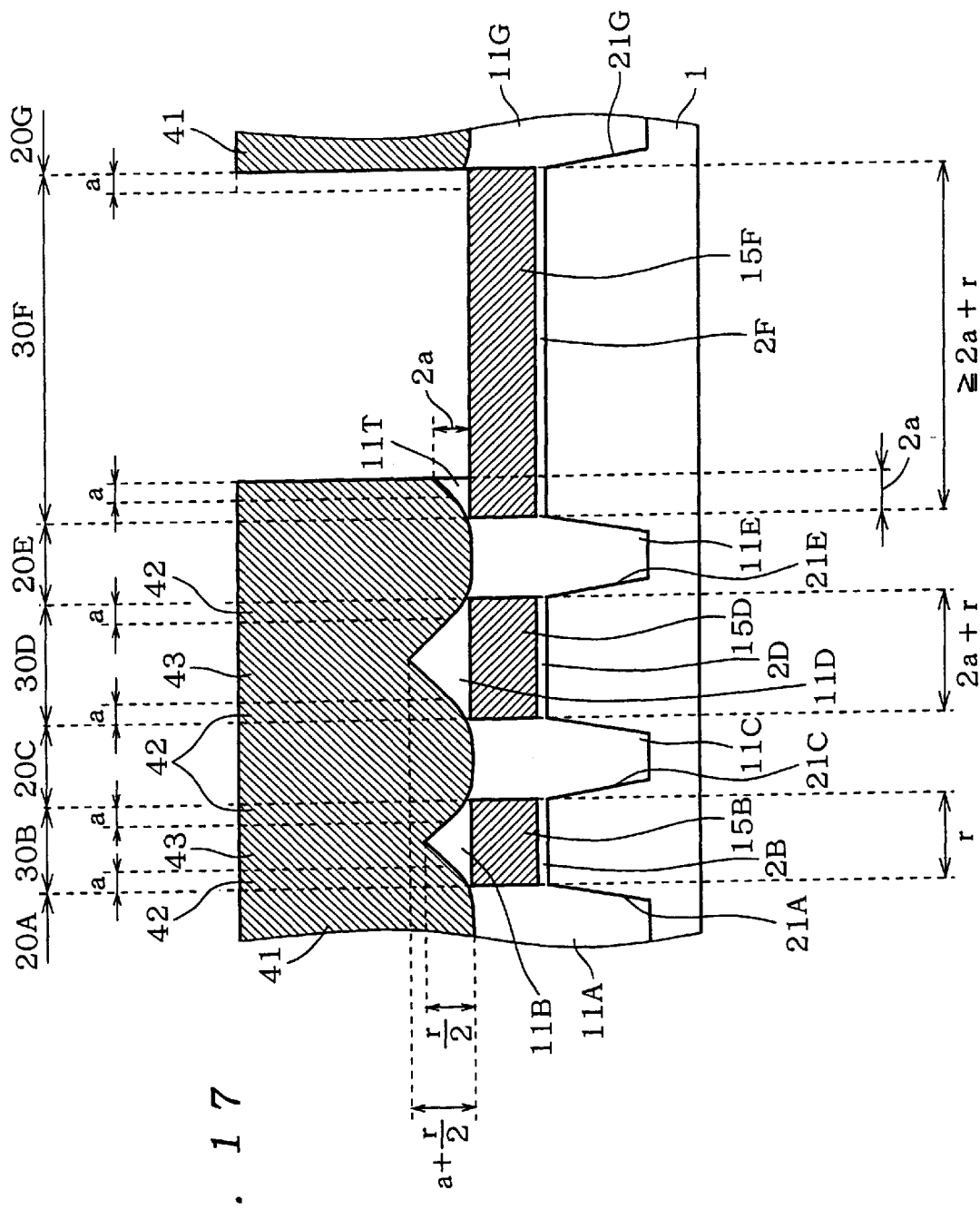

Now, detailed discussion on the method of manufacturing the semiconductor device in accordance with the second preferred embodiment will be further made with reference to FIGS. 15 to 17.

Figure 9:
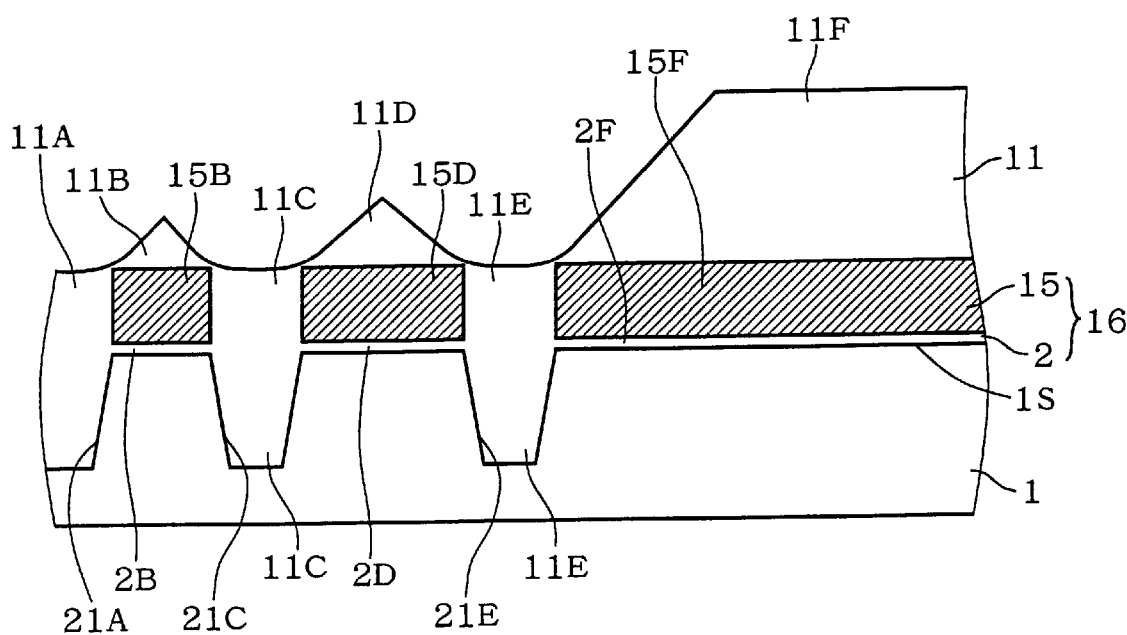

When the silicon oxide film is first deposited by HDP-CVD, as shown in FIG. 9, for example, the silicon oxide film 11 on the surface of the polycrystalline silicon film 15 (i.e., in the active region 30 of FIG. 8) has a section of triangle as mentioned earlier. A sloped plane of each triangle of the protrusions 11B and 11D has an angle of tilt of about 45 degrees with respect to the surface 1S of the semiconductor substrate 1 from an end portion of the surface of the active region, i.e., the hardmask layer 16 (i.e., the surface of the polycrystalline silicon film 15). In FIG. 15 schematically showing each of the protrusions 11B and 11D, assuming the width of the active region to be x, the height thereof is x/2. If the width of the active region is larger than twice the film thickness of the silicon oxide film 11 to be formed, the protrusion has a section of trapezoidal, like the silicon oxide film 11F of FIG. 9 for example.

FIG. 16 is a cross section showing the semiconductor device after the fifth step of the second preferred embodiment, and is different from FIG. 11 showing the fifth step of the second preferred embodiment in the width of the polycrystalline silicon film 15 (i.e., the width of the active region). In FIG. 16, the width of the active region 30D is a sum of twice the alignment margin a (2a) and the minimum design size r (2a+r) and that of the active region 30F is not smaller than the above width (2a+r).

Heights of the protrusions 11B and 11D formed in the active region 30 are r/2 and (a+r/2), respectively. Therefore, the protrusion 11D which is highest among the protrusions 11 exists in the active region 30D whose width is a sum of twice the alignment margin a (2a) and the minimum design size r (2a+r).

In this case, as shown in FIG. 16, since the resist 41 consisting of the second and third resist portions 42 and 43 is so formed as to cover the whole surface of the active regions 30B and 30D according to the fourth step as mentioned above, the protrusions 11B and 11D are not removed by dry etching in the fifth step.

On the other hand, since the silicon oxide film 11F (see FIG. 9) formed in the active region 30 having a width of not smaller than (2a+r), e.g., the active region 30F of FIG. 16, is removed by dry etching in the fifth step, no protrusion of silicon oxide film exists on the surface of the exposed polycrystalline silicon film 15F. On an end portion (a region having a width a from each periphery) of the surface of the polycrystalline silicon film 15F, however, the protrusion 11T (having a height a) masked by the second resist portion 42 is left.

Thus, when the resist 41 of FIG. 16 is used as a mask, the highest one of the protrusions left after dry etching is the protrusion 11D (having a height a+r/2) formed in the active region 30D (having a width 2a+r). Therefore, a process parameter such as time for etching is determined so that the protrusion 11D can be removed in the wet etching of the sixth step after removing the resist 41.

A case of FIG. 17 where misalignment at maximum amount (alignment margin a) occurs in the photolithography (the fourth step) will be studied now. FIG. 17 shows misalignment of patterning of the resist 41 to the right with respect to that of FIG. 16.

The protrusions 11B (having a height r/2) and 11D (having a height a+r/2) are not etched in the fifth step, like the case of FIG. 16. By contrast, since a silicon oxide film (having a width 2a) at an end portion of the silicon oxide film 11F (see FIG. 9) formed on the surface of the polycrystalline silicon film 15F on the side of the device isolation region 20E is covered with the second resist portion 42, it is not etched, being left as the protrusion 11T (having a height 2a).

In this case, an etching parameter (such as time for etching) for the wet etching with hydrofluoric acid in the sixth step is determined so that a higher one of the protrusions 11D (having a height a+r/2) and 11T (having a height 2a) can be removed.

Even if the HDP-CVD is performed under a film-formation condition that the sloped plane of the protrusion has an angle of tilt of not 45 degrees, a parameter for the wet etching may be determined according to like geometrical study.

On the other hand, since a top portion of the buried oxide 11 serving as a device isolation dielectric is also etched through the two wet etchings using hydrofluoric acid in the sixth step, it is necessary to determine a parameter so that the top portion of the buried oxide 11 may be higher than the surface 1S of the semiconductor substrate 1 after the two wet etchings. Therefore, in the first step of the method of manufacturing the semiconductor device in accordance with the second preferred embodiment, the film thickness of the polycrystalline silicon film 15 is determined not smaller than the amount of film to be etched in the first etching of the sixth step, i.e., not lower than the height of the highest protrusion. If the film thickness of the polycrystalline silicon film 15 is determined higher than the height of the highest protrusion, since the aspect ratio of the trench 21 becomes higher to require a careful formation of the silicon oxide film 11, it is preferable to determine the film thickness of the polycrystalline silicon film 15 to be the height of the highest protrusion.

If the silicon oxide film 11 is removed by dry etching using a resist having the second resist portion 42 and not having the third resist portion 43 as a mask, instead of the resist 41, the film thickness of the polycrystalline silicon film 15 may be not smaller than twice the alignment margin a (2a) (the best thickness of the polycrystalline silicon film 15 is twice the alignment margin a (2)).

Effect of The Second Preferred Embodiment

The method of manufacturing the semiconductor device of the second preferred embodiment produces the same effects ① to ⑥ as that of the first preferred embodiment, and further produces the following prominent effects.

(i) First, according to the method of manufacturing the semiconductor device of the second preferred embodiment, the maximum value of misalignment is a if any and the buried oxide 11 is always covered with the resist 41 as shown in FIG. 17 since the resist 41 has the second resist portion 42. The buried oxide 11 is not thereby removed by dry etching in the fifth step. That produces an effect of obtaining the silicon oxide 11 serving the device isolation dielectric whose top portions are surely flat at the same level in the whole surface of the semiconductor substrate 1.

The width of the second resist portion 42 is the alignment margin a, and if the width is smaller, the above effect (i) can not be achieved. If larger, the above effect (i) is achieved but the height of the protrusion 11T of FIG. 17 becomes higher. That increases the amount of silicon oxide film 11 to be etched by wet etching if the protrusion 11T is highest, and the top portion of the buried oxide 11 is thereby etched by amounts more than the determined value. Increasing the film thickness of the polycrystalline silicon film 15 in order to avoid this situation makes the aspect ratio of the trench 21 larger. Therefore, the width of the second resist portion 42 should be the alignment margin a.

(ii) Even if the resist 41 has the second and third resist portions, since the height of the protrusion left after the dry etching of the silicon oxide film 11 (such as the protrusions 11B, 11D and 11T of FIG. 17) does not exceed either twice the alignment margin a (2a) of the device or the sum of the alignment margin a and half of the minimum design size r (a+r/2), all these protrusions are removed according to the parameter for the wet etching determined as above, not being left in the subsequent steps.

(iii) Since the film thickness of the polycrystalline silicon film 15 of FIG. 8 is determined to be a larger one of twice the alignment margin a (2a) of the semiconductor device and a sum of the alignment margin a and half of the minimum design size r (a+r/2) of the semiconductor device, the top portion of the buried oxide 11 serving as the device isolation dielectric does not become lower than the height of the surface 1S of the semiconductor substrate 1 after the wet etching with hydrofluoric acid in removing the protrusion and the underlaid oxide film 2, and thus the same effect as (i) is achieved.

(iv) Further, according to the manufacturing method of the second preferred embodiment, the resist 41 has the second resist portion 42 existing on the too small active region 30, and the resist 41 is formed on the whole surface of a region of the active region 30 whose width is not larger than the minimum design size. Therefore, the method of the second preferred embodiment does not create any pattern not larger than the minimum design size and does not raise the need for reduction of design rule. Thus, the method of the second preferred embodiment produces the same effect as (i) in a simple manner.

Application of The First and Second Preferred Embodiments

FIGS. 18 to 21 are cross sections showing a process of manufacturing e.g., a DRAM memory cell in the active region isolated by the device isolation region formed by the method of the first or second preferred embodiment. Detailed discussion will be made below on a process of manufacturing the DRAM memory cell with reference to FIGS. 18 to 21, to show advantages that the trench-type device isolation structure obtained by the present process provides for the semiconductor device.

First, by the method of the first or second preferred embodiment, a cuneate device isolation dielectric 51 is formed in the p-type silicon substrate 1, to provide a device isolation region 80 and an active region 90 in the silicon substrate 1.

Figure 18:
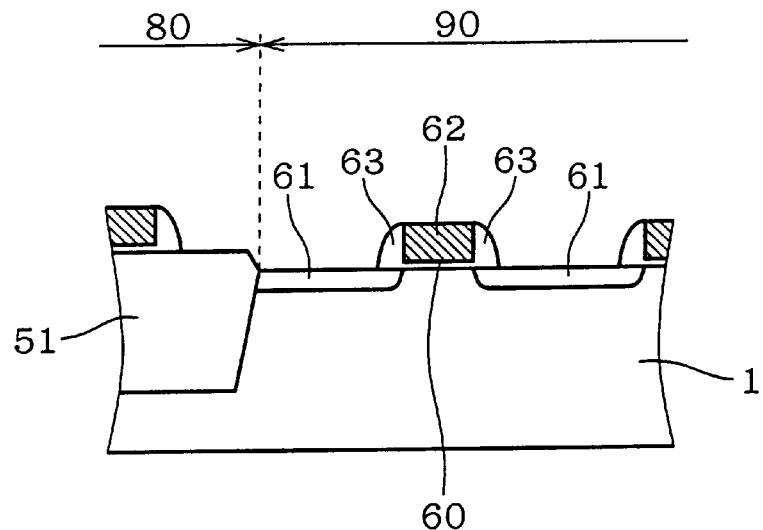
FIGS. 18 to 21 are cross sections showing process steps of manufacturing a semiconductor device in accordance with an application of the first and second preferred embodiments of the present invention.

After that, as shown in FIG. 18, a p-type well (not shown) is formed and a silicon oxide film is formed to have a film thickness of about 100 Å, which is to serve as a gate oxide film, by thermal oxidation on a surface of the active region 90 in the silicon substrate 1. Subsequently, a polycrystalline silicon film which is a gate electrode material is formed to have a film thickness of about 1000 Å by CVD on a surface of the silicon oxide film.

With a resist (not shown) formed in a predetermined region by photolithography as a mask, the polycrystalline silicon film is patterned by anisotropic etching, to form a gate electrode 62 made of the polycrystalline silicon film and a gate oxide film 60 made of the silicon oxide film as shown in FIG. 18. The resist is thereafter removed.

With the trench-type device isolation dielectric 51, the gate electrode 62 and the gate oxide film 60 as a mask, As ion is implanted at a dose of $5\times10^{13}/cm^2$ at an energy of 50 keV, to form an n-type layer 61 which is to serve as a source region or a drain region.

A silicon oxide film (not shown) is deposited to have a thickness of about 1000 Å by CVD so that the film may cover the whole surface of the silicon substrate 1. The silicon oxide film is anisotropically etched, as shown in FIG. 18, to form a side wall insulating film 63.

Figure 19:
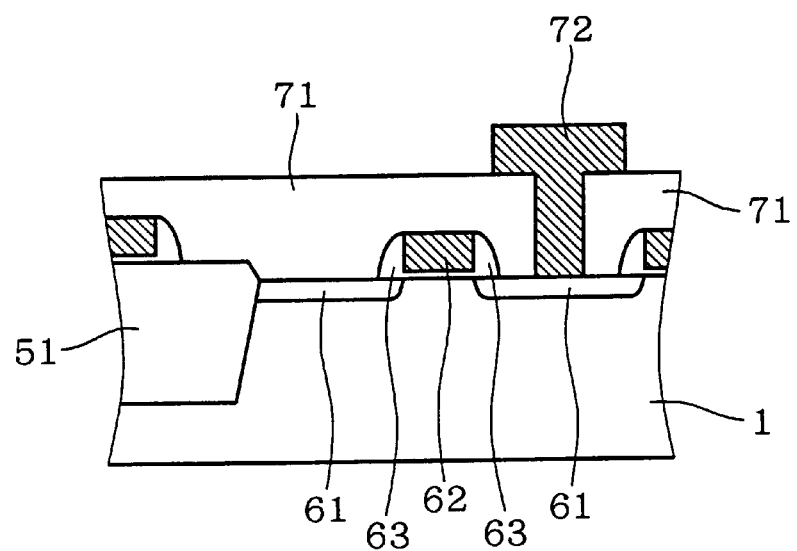

A silicon oxide film is deposited to have a thickness of about 7000 Å by CVD on the whole surface of the silicon substrate 1, which is to serve as an interlayer insulating film 71. A polycrystalline silicon of about 1000 Å containing an impurity and a tungsten silicide (WSi) of about 1000 Å to serve as a bit-line wire are deposited in a bit-line contact hole and on the whole surface of the interlayer insulating film. The polycrystalline silicon and the tungsten silicide (WSi) are patterned, as shown in FIG. 19, to form a bit-line wire 72.

Figure 20:
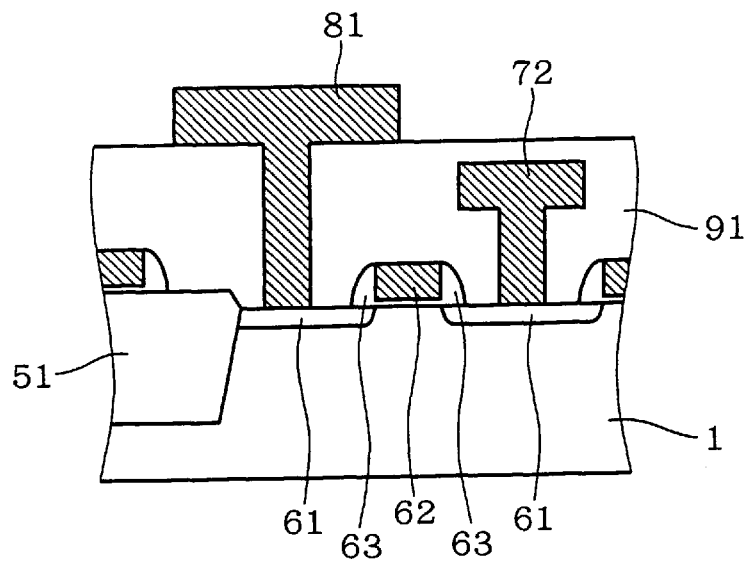

A silicon oxide film is deposited again by CVD to have a thickness of about 7000 Å, which is to serve as an interlayer insulating film, so that the film may cover the whole surface of the interlayer insulating film 71 and the wire 72. This silicon oxide film and the silicon oxide film 71 are united to form an interlayer insulating film 91. A storage-node contact hole is provided at a predetermined portion in the interlayer insulating film 91 and a polycrystalline silicon (which is to serve as a bottom electrode of capacitor) containing an impurity of about 8000 Å is deposited on the interlayer insulating film 91 and inside the storage-node contact hole. The polycrystalline silicon is patterned, as shown in FIG. 20, to form a storage node 81 only in the predetermined region.

Figure 21:
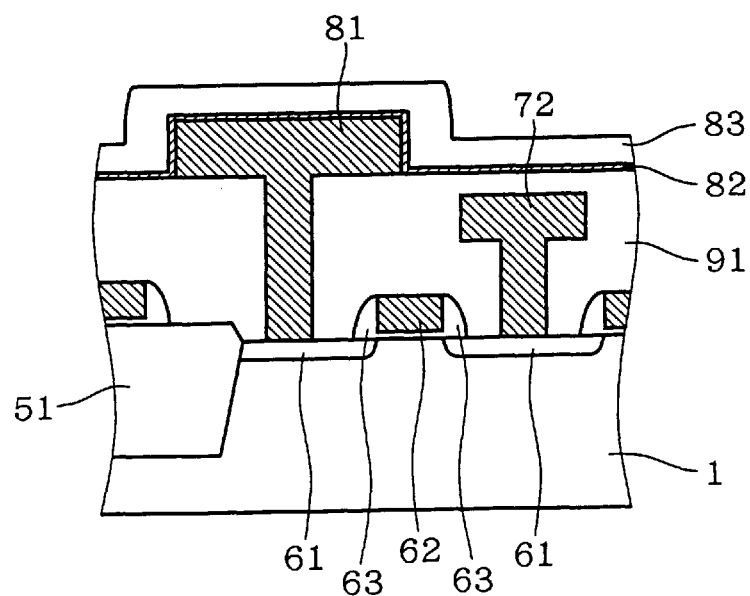
Figure 22:
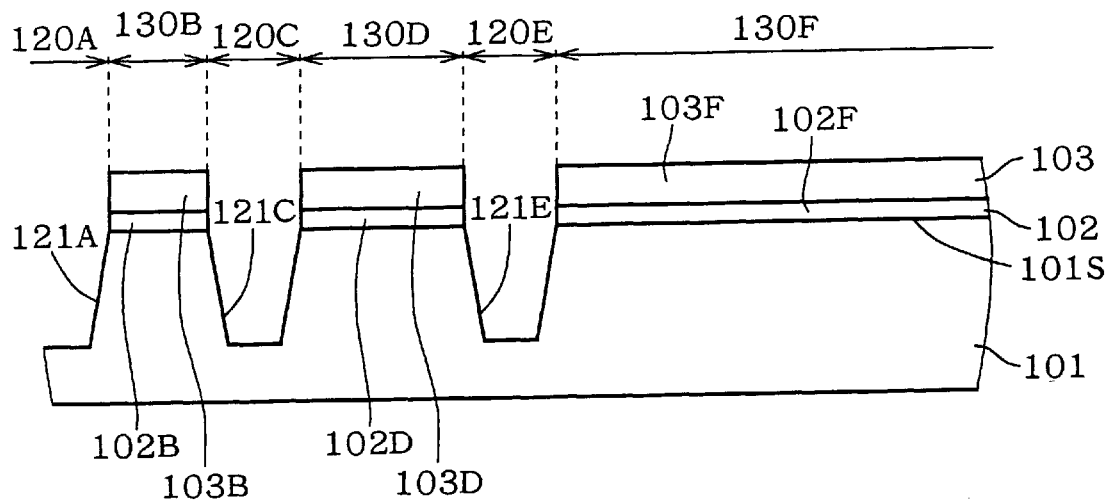
FIGS. 22 to 26 are cross sections showing process steps of manufacturing a semiconductor device in the prior art.
Figure 23:
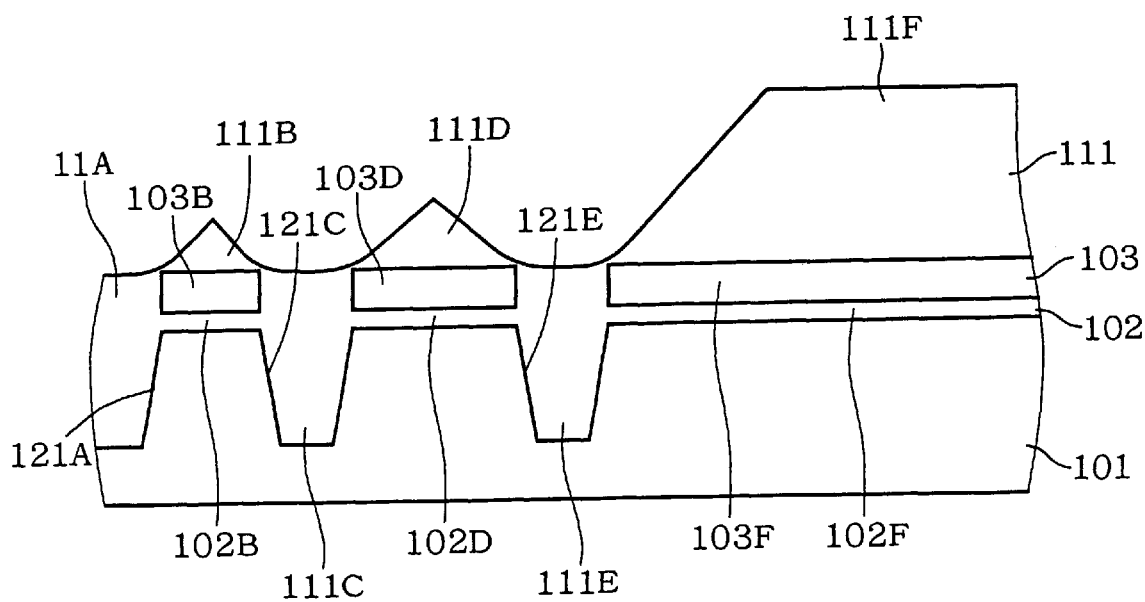

A silicon oxinitride (SiON) film 82 is deposited by CVD to have a thickness of about 70 Å, which is to serve as a capacitor dielectric film, so that the film may cover the whole surface of the interlayer insulating film 91 and the storage node 81 as shown in FIG. 21. Subsequently, a polycrystalline silicon film containing an impurity is deposited by CVD to have a thickness of about 500 Å, which is to serve as an upper electrode of capacitor, as shown in FIG. 21. The polycrystalline silicon film is patterned to form a cell plate 83 only in a predetermined region.

Through the above process, a cell of the DRAM device is completed. After that, the DRAM device is connected to peripheral circuits with wires, but no discussion will be made on this connection which is not essential in this application example.

The DRAM device manufactured through the above process has the following advantages. The cuneate device isolation dielectric 51, which is manufactured by the method of the first or second preferred embodiment, has no seam in the trench and has the top portion of excellent flatness and a uniform height in the substrate 1. The silicon substrate 1 in the active region 90 also has a surface of excellent flatness. Therefore, no electrical interference occurs between the active regions and each device can independently operate, whereby the DRAM device achieves a very stable operation.

Further, by the method of the first and second preferred embodiments, the DRAM device is advantageously manufactured at lower cost with higher yield than the prior-art DRAM device with trench-type isolation which is manufactured by dry etching and CMP together. Since the process of the present invention is simpler and easier than the prior-art process using dry etching and CMP together, especially, it is possible to provide a lower-priced DRAM device.

While the invention has been shown and described in detail, the foregoing description is in all aspects illustrative and not restrictive. It is therefore understood that numerous modifications and variations can be devised without departing from the scope of the invention.

We claim:

1. A method of manufacturing a semiconductor device, comprising:
    a first step of forming a hardmask layer including at least one layer on a surface of a semiconductor substrate;
    a second step of forming a trench serving as a device isolation region and an active region which is a region other than said device isolation region inside said semiconductor substrate by etching part of said semiconductor substrate from a predetermined region in a surface of said hardmask layer;
    a third step of forming a dielectric by a film-formation method in which an etching and a deposition are simultaneously performed on said surface of said hardmask layer and in said trench to bury said dielectric in said trench to the same level as said surface of said hardmask layer;
    a fourth step of forming a resist on a surface of said dielectric at least in said device isolation region;
    a fifth step of removing all of said dielectric on said active region with said resist as a mask, said dielectric is not covered with said resist; and
    a sixth step of removing said resist and said hardmask layer in this order.

2. The method according to claim 1, wherein
    at least one layer included in said hardmask layer is hard to etch in dry etching for said dielectric, and said fifth step comprises the step of
removing said dielectric by dry etching.

3. The method according to claim 2, wherein
at least one layer included in said hardmask layer is a non-single crystalline silicon film.

4. A method of manufacturing a semiconductor device, comprising:
a first step of forming a hardmask layer including at least one layer on a surface of a semiconductor substrate;
a second step of forming a trench serving as a device isolation region and an active region which is a region other than said device isolation region inside said semiconductor substrate by etching part of said semiconductor substrate from a predetermined region in a surface of said hardmask layer;
a third step of forming a dielectric by a film-formation method in which an etching and a deposition are simultaneously performed on said surface of said hardmask layer and in said trench to bury said dielectric in said trench to the same level as said surface of said hardmask layer;
a fourth step of forming a resist on a surface of said dielectric at least in said device isolation region;
a fifth step of removing said dielectric on said active region with said resist as a mask, said dielectric is not covered with said resist; and
a sixth step of removing said resist and said hardmask layer in this order, wherein said fourth step comprises the step of forming said resist on said dielectric in said active region so that said resist extends by a length corresponding to an alignment margin from an end portion of said device isolation region towards said active region; and
said sixth step comprises the step of etching said dielectric with hydrofluoric acid before removing said hardmask layer after removing said resist.

5. The method according to claim 4, wherein
said hardmask layer is formed to have a film thickness larger than twice said alignment margin.

6. The method according to claim 4, wherein
said fourth step comprises the step of
forming another resist on said surface of said dielectric in a region between said resist extending to said active region and an adjacent resist thereof when said region has a length not more than a minimum design size of said semiconductor device.

7. The method according to claim 6, wherein
said hardmask layer is formed to have a film thickness larger than a larger one of twice said alignment margin and a sum of said alignment margin and half of said minimum design size.

* * * * *